(12) United States Patent
Akahori et al.

(10) Patent No.: US 7,589,775 B2
(45) Date of Patent: *Sep. 15, 2009

(54) SOLID-STATE IMAGING DEVICE

(75) Inventors: Hiroshi Akahori, Hamamatsu (JP); Tatsuki Kasuya, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 396 days.

This patent is subject to a terminal disclaimer.

(21) Appl. No.: 10/554,105

(22) PCT Filed: Apr. 22, 2004

(86) PCT No.: PCT/JP2004/005808

§ 371 (c)(1),
(2), (4) Date: Aug. 24, 2006

(87) PCT Pub. No.: WO2004/095581

PCT Pub. Date: Nov. 4, 2004

(65) Prior Publication Data

US 2007/0063232 A1 Mar. 22, 2007

(30) Foreign Application Priority Data

Apr. 23, 2003 (JP) ............................. 2003-118730

(51) Int. Cl.
*H04N 3/14* (2006.01)
*H04N 5/335* (2006.01)
(52) U.S. Cl. ...................................... 348/311; 348/294
(58) Field of Classification Search ................. 348/281, 348/294, 324, 317, 319, 298, 300
See application file for complete search history.

(56) References Cited

U.S. PATENT DOCUMENTS 4,367,404 A    1/1983   Kaye
4,646,119 A *  2/1987   Kosonocky ................. 377/60

(Continued)

FOREIGN PATENT DOCUMENTS

EP    0 732 702    9/1996

(Continued)

*Primary Examiner*—Tuan V Ho
*Assistant Examiner*—Jason Flohre
(74) *Attorney, Agent, or Firm*—Drinker Biddle & Reath LLP

(57) ABSTRACT

An energy ray sensitive region 11 is divided in its horizontal direction into m columns with the vertical direction as the longitudinal direction, divided in its vertical direction into n rows with the horizontal direction as the longitudinal direction, and is thereby provided with m×n photoelectric conversion portions 13 that are arrayed two-dimensionally. Each of these photoelectric conversion portions 13 generates charges in response to the incidence of energy rays. On the front surface side of energy ray sensitive region 11, a plurality of transfer electrodes 15 are disposed so as to cover energy ray sensitive region 11. The plurality of transfer electrodes 15 are respectively disposed with the horizontal direction as the longitudinal direction and are aligned in the vertical direction. The respective transfer electrodes 15 are electrically connected by voltage dividing resistors 17. Each voltage dividing resistor 17 is disposed in correspondence to each transfer electrode 15, divides a DC output voltage from a DC power supply 19 to generate a DC output potential, and applies this DC output potential to the corresponding transfer electrode 15.

3 Claims, 4 Drawing Sheets

U.S. PATENT DOCUMENTS

| | | |
|---|---|---|
| 5,453,610 A | 9/1995 | Gibbons |
| 5,512,755 A | 4/1996 | Vickers et al. |
| 5,615,242 A | 3/1997 | Hirota |
| 5,637,959 A | 6/1997 | Kyushima et al. |
| 5,880,457 A | 3/1999 | Tomiyama et al. |
| 6,177,665 B1 | 1/2001 | Wolf |
| 6,841,936 B2 | 1/2005 | Keller et al. |
| 7,030,355 B1 | 4/2006 | Bochenski et al. |

FOREIGN PATENT DOCUMENTS

| | | |
|---|---|---|
| JP | 48-41159 | 5/1973 |
| JP | 53-27382 | 3/1978 |
| JP | 55-165687 | 12/1980 |
| JP | 55165687 | 12/1980 |
| JP | 56-057367 | 5/1981 |
| JP | 57-105893 | 7/1982 |
| JP | 60-062280 | 4/1985 |
| JP | 61-164383 | 7/1986 |
| JP | 5-75090 | 3/1993 |
| JP | 05-182490 | 7/1993 |
| JP | 05182490 | 7/1993 |
| JP | 10-178588 | 6/1998 |
| JP | 11-136558 | 5/1999 |
| JP | 2000-92398 | 3/2000 |
| JP | 2002-196075 | 7/2002 |

* cited by examiner

SOLID-STATE IMAGING DEVICE

TECHNICAL FIELD

The present invention relates to a solid-state imaging apparatus.

BACKGROUND ART

Among solid-state imaging apparatuses, having an energy ray sensitive portion wherein pixels are arrayed two-dimensionally, there are known solid-state imaging apparatuses that are used as one-dimensional line sensors by carrying out a binning (line binning) operation to enable detection of the distribution of weak light at high precision (see, for example, Patent Document 1).

The binning operation refers to the operation of transferring photoelectric charges, which have been accumulated according to each of a plurality of pixels (photoelectric conversion units) that are arrayed two-dimensionally in a row direction and a column direction, across entire columns and summing the charges accumulated in the respective pixels in the column direction according to each column in one step and then transferring the charges, which have been summed in one step according to each column, in the row direction. By this binning operation, since the charges that have been accumulated in the respective pixels in the column direction are summed according to each column, the distribution of light in the row direction can be detected at a comparatively high precision, even in the case of weak light.

[Patent Document 1] Japanese Published Unexamined Patent Application No. 2002-196075

DISCLOSURE OF THE INVENTION

With the solid-state imaging apparatus of the composition described in the above-mentioned Patent Document 1, the charges accumulated in each pixel are successively transferred to a subsequent pixel by application of a drive voltage (transfer voltage) of predetermined phase to a transfer electrode, formed with the row direction as the longitudinal direction. A transfer time corresponding to the number of pixels is thus required and much time is required to sum the charges accumulated in the respective pixels according to each column. Also, in a case where a plurality of transfer electrodes are provided for a single pixel, drive voltages of a plurality of phases that differ must be applied to the respective transfer electrodes, making transfer control complicated.

The present invention has been made in view of the above point and an object thereof is to provide a solid-state imaging apparatus by which the binning operation can be performed at high speed and yet simply.

In order to achieve the above object, a solid-state imaging apparatus according to the present invention comprises: an energy ray sensitive region, being formed on a front surface side of a semiconductor substrate, having a plurality of photoelectric conversion portions that are arrayed two-dimensionally, and generating charges in response to the incidence of energy rays; a plurality of transfer electrodes, each being disposed on the front surface side of the energy ray sensitive region with a first direction of the two-dimensional array as the longitudinal direction and transferring the charges in a second direction of the two-dimensional array; and voltage dividing resistors, disposed in correspondence to the transfer electrodes and each dividing a DC output voltage from a DC power supply to generate a DC output potential and providing the DC output potential to the corresponding transfer electrode.

Here, energy rays shall include ultraviolet rays, infrared rays, visible light as well as electron beams, radiation, and X-rays.

In the solid-state imaging apparatus according to the present invention, each of the plurality of transfer electrodes is provided with the DC output potential that is generated by a corresponding voltage dividing resistor. The potential formed under the plurality of transfer electrodes thus increases gradually in the charge transfer direction and a single potential gradient is formed for each set of photoelectric conversion portions that are arrayed in the second direction. The generated charges are moved along the potential gradient. There is thus no need to apply the drive voltage of predetermined phase for the charge transfer as in the conventional art and the charge transfer can be performed in a simple manner. Also, since the transfer speed is governed by the potential gradient and is made high, the transfer time can be shortened.

Also, a solid-state imaging apparatus according to the present invention comprises: an energy ray sensitive region, being formed on a front surface side of a semiconductor substrate, having a plurality of photoelectric conversion portions that are arrayed two-dimensionally, and generating charges in response to the incidence of energy rays; and a plurality of transfer electrodes, each being disposed on the front surface side of the energy ray sensitive region with a first direction of the two-dimensional array as the longitudinal direction and transferring the charges in a second direction of the two-dimensional array; wherein a predetermined potential is applied to each of the plurality of transfer electrodes in such a manner that the potential formed under the plurality of transfer electrodes increases gradually in the charge transfer direction.

In the solid-state imaging apparatus according to the present invention, the potential formed under the plurality of transfer electrodes increases gradually in the charge transfer direction and a single potential gradient is formed for each set of pixels that are arrayed in the second direction. The generated charges are moved along the potential gradient. There is thus no need to apply the drive voltage of predetermined phase for the charge transfer as in the conventional art and the charge transfer can be performed in a simple manner. Also, since the transfer speed is governed by the potential gradient and is made high, the transfer time can be shortened.

Preferably, a charge accumulation portion, accumulating the charges, which have been transferred by the plurality of transfer electrodes, according to each set of the photoelectric conversion portions arrayed in the second direction and outputting the accumulated charges in a batch according to each set of photoelectric conversion portions, and a charge outputting portion, inputting and then successively outputting the charges output from the charge accumulation portions according to each set of the photoelectric conversion portions arrayed in the second direction, are also equipped.

Also, a solid-state imaging apparatus according to the present invention comprises: a set of transfer electrodes, disposed via an insulating layer on the front surface of a semiconductor substrate and aligned in a single direction, and voltage dividing resistors that electrically connect the respective transfer electrodes.

In the solid-state imaging apparatus according to the present invention, since the respective transfer electrodes are electrically connected by voltage dividing resistors, the potential formed under the set of the transfer electrodes increases gradually in the alignment direction of the transfer electrodes, that is, in the charge transfer direction, and a single potential gradient is formed for the set of the transfer electrodes. The generated charges are moved along this potential gradient. There is thus no need to apply a drive voltage of predetermined phase for the charge transfer as in the conventional art and the charge transfer can be performed in a simple manner. Also, since the transfer speed is governed by the potential gradient and is made high, the transfer time can be shortened.

Preferably, each of the voltage dividing resistors divides a DC output voltage from a DC power supply. With the composition, the above-mentioned potential can be formed in a stable manner.

Preferably, a charge accumulation portion, accumulating the charges, which have been transferred by the set of the transfer electrodes, and outputting the accumulated charges in a batch, and a charge outputting portion, inputting and then successively outputting the charges output from the charge accumulation portions, are also equipped.

BEST MODES FOR CARRYING OUT THE INVENTION

A solid-state imaging apparatus of embodiments of the present invention shall now be described with reference to the drawings. Identical elements or elements with identical functionality will be denoted by the same reference symbols in the description, without redundant description.

Figure 1:
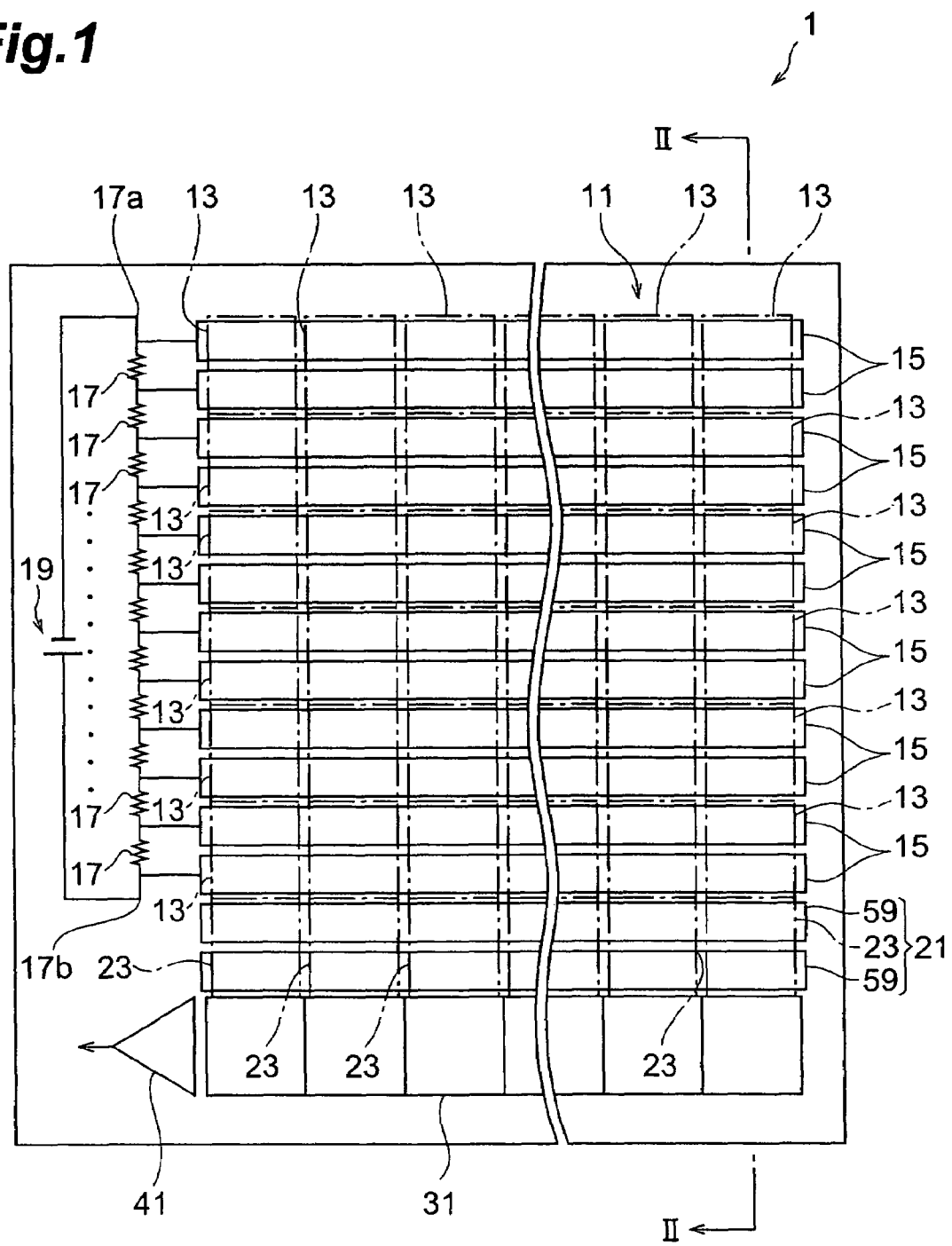
FIG. 1 is a schematic composition diagram showing a solid-state imaging apparatus of an embodiment.
Figure 2:
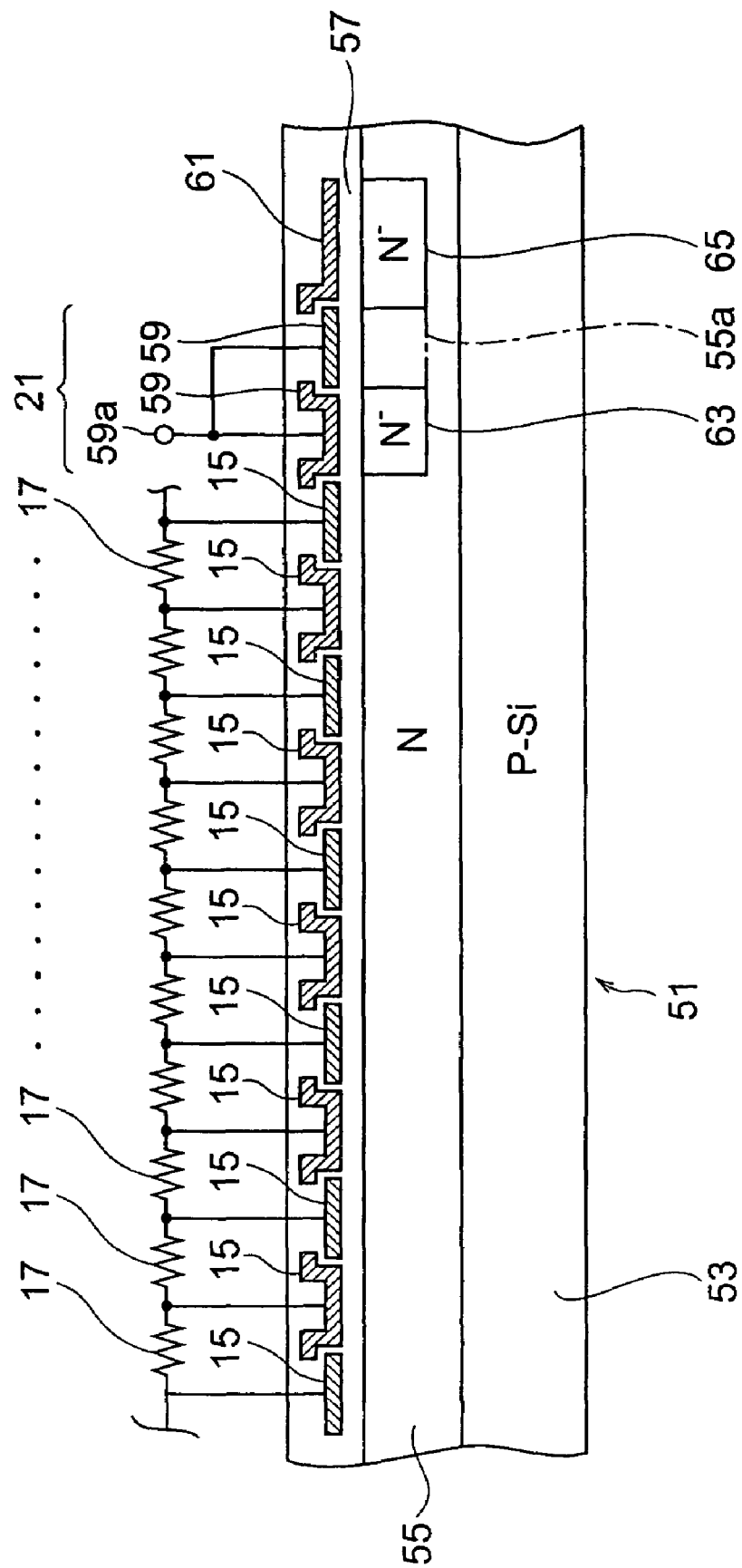
FIG. 2 is a diagram for describing the cross-sectional composition along line II-II of FIG. 1.

FIG. 1 is a schematic composition diagram showing the solid-state imaging apparatus of the embodiment. FIG. 2 is a diagram for describing the cross-sectional arrangement along line II-II of FIG. 1.

A solid-state imaging apparatus 1 is a full-frame transfer (FFT) CCD and, as shown in FIG. 1, comprises an energy ray sensitive region 11, a vertical transfer gate portion 21, which functions as a charge accumulation portion, and a horizontal shift register 31, which functions as a charge outputting portion.

Energy ray sensitive region 11 has a plurality of photoelectric conversion portions 13 that are arrayed two-dimensionally in m columns (where m is an integer of no less than 2) and n rows (where n is an integer of no less than 2 and is set to "6" in the present embodiment). Each of photoelectric conversion portions 13 generates charges in response to the incidence of energy rays (ultraviolet rays, infrared rays, visible light, electron beam, etc.).

On the front surface side of energy ray sensitive region 11, a plurality of transfer electrodes 15 are positioned so as to cover energy ray sensitive region 11. The plurality of transfer electrodes 15 are disposed with the horizontal direction (first direction in the above-mentioned two-dimensional array) as the longitudinal direction of each and are aligned in the vertical direction (second direction in the above-mentioned two-dimensional array). With the present embodiment, two transfer electrodes 15 are provided for each row and two different types of voltages are applied by resistance division.

The respective transfer electrodes 15 are electrically connected by voltage dividing resistors 17. Each voltage dividing resistor 17 is disposed in correspondence to each transfer electrode 15. Each voltage dividing resistor 17 divides a DC output voltage from a DC power supply 19 to generate a DC output potential and applies the DC output potential to the corresponding transfer electrode 15.

Vertical transfer gate portion 21 has m accumulation portions 23, each accumulating charges generated at photoelectric conversion portions 13 according to each set of photoelectric conversion portions 13 that are arrayed in the vertical direction. Each accumulation portion 23 accumulates charges transferred from the corresponding set of photoelectric conversion portions 13 and output the accumulated charges in a batch according to the set of photoelectric conversion portions 13.

Horizontal shift register 31 receives the charges accumulated in and output from the respective charge accumulation portions 23 of vertical transfer gate portion 21, transfers these charges in the horizontal direction, and successively outputs the charges to an amplifying portion 41. By the amplifying portion 41, the charges output from horizontal shift register 31 are converted into voltages, each of which is output to the exterior of solid-state imaging apparatus 1 as a voltage according to each set of photoelectric conversion portions 13 arrayed in the vertical direction, that is, a voltage according to each column.

Energy ray sensitive region 11, transfer electrodes 15, vertical transfer gate portion 21, horizontal shift register 31, voltage dividing resistors 17, and other circuits are formed on a semiconductor substrate 51 as shown in FIG. 2. Semiconductor substrate 51 comprises a P-type Si substrate 53, which is of a P conduction type and serves as the base member of semiconductor substrate 51, and N-type semiconductor layers 55 and P$^+$-type semiconductor layers (not shown), which are formed on the front surface side of P-type Si substrate 53. N-type semiconductor layers 55 and the P$^+$-type semiconductor layers are disposed alternatingly in the horizontal direction with the vertical direction of energy sensitive region 11 as the longitudinal direction. P-type Si substrate 53 and each N-type semiconductor layer 55 forms a pn junction. Each N-type semiconductor layer 55 is an energy ray sensitive region that generates charges upon incidence of energy rays. N-type semiconductor layers 55 form the respective columns of energy ray sensitive region 11. The P$^+$-type semiconductor layers function as isolation regions that separate the respective columns.

Transfer electrodes 15 are disposed via an insulating layer 57 on the front surface of semiconductor layer 51. Transfer electrodes 15 are disposed alternatingly in the vertical direction with the horizontal direction of energy ray sensitive region 11 as the longitudinal direction and form the respective rows. Photoelectric conversion portions 13, which are arrayed two-dimensionally in n rows and m columns are arranged from these N-type semiconductor layers 55 and transfer electrodes 15. Transfer electrodes 15 and insulating layer 57 are formed of materials that transmit energy rays. In the present embodiment, transfer electrodes 15 are formed of polysilicon films and insulating layer 57 is formed of a silicon oxide film.

Also on the front surface of semiconductor substrate 51, gate electrodes 59 and a set of horizontal transfer electrodes 61 are disposed via insulating layer 57. Gate electrodes 59 are disposed adjacent transfer electrode 15, which is positioned at the most downstream side in the charge transfer direction, and with the horizontal direction of energy ray sensitive region 11 as the longitudinal direction. A clock signal, with which the voltage level is either the H level or the L level, is input via a terminal 59a into gate electrodes 59. Semiconductor substrate 51 has a barrier region 63, formed so as to be a low-concentration N-type semiconductor in N-type semiconductor layer 55 below gate electrode 59 that is positioned next to transfer electrodes 15. This barrier region 63 is disposed with the horizontal direction of energy ray sensitive region 11 as the longitudinal direction. Barrier region 63 and an N-type semiconductor region 55a exist below gate electrodes 59 and vertical transfer gate portion 21 is arranged from these gate electrodes 59 and regions 63 and 55a.

The set of horizontal transfer electrodes 61 are aligned adjacent gate electrodes 59 and along the horizontal direction of energy ray sensitive region 11. Horizontal shift register 31 is arranged by the step-like potentials formed by the set of horizontal transfer electrodes 61, N-type semiconductor layers 55 below the set of horizontal transfer electrodes 61, low-concentration N-type semiconductor regions 65, formed in the N-type semiconductor layers 55, etc.

The operation of solid-state imaging apparatus 1 of the above-described composition shall now be described. FIGS. 3A to 3D are timing charts for describing the operation of the solid-state imaging apparatus of the present embodiment. FIGS. 4A and 4B are diagrams of the vertical direction potential that show the condition of charges at times $t_a$ and $t_b$, respectively.

Figure 3A:
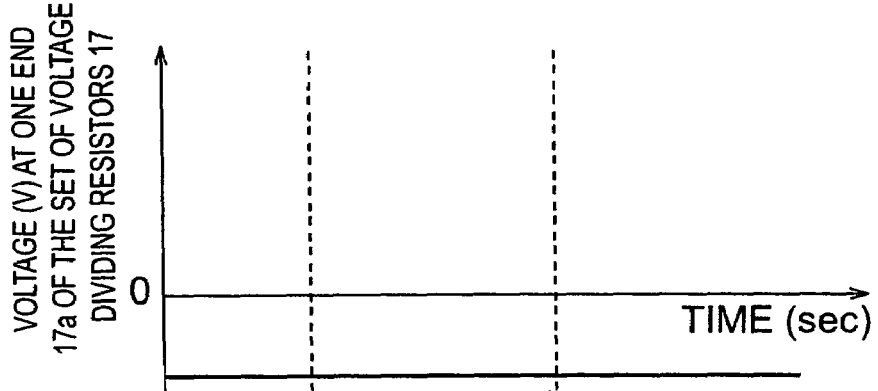
FIG. 3A is a timing chart for describing the operation of the solid-state imaging apparatus of the embodiment and shows the variation of the voltage at one end 17a of a set of voltage dividing resistors 17.
Figure 3B:
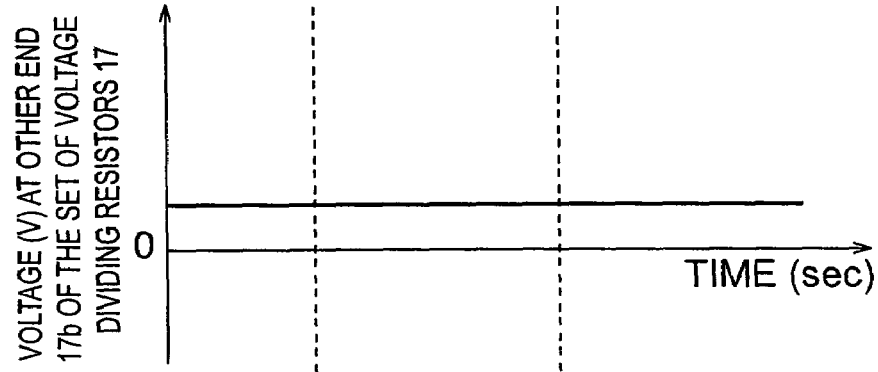
FIG. 3B is a timing chart for describing the operation of the solid-state imaging apparatus of the embodiment and shows the variation of the voltage at another end 17b of the set of voltage dividing resistors 17.
Figure 4A:
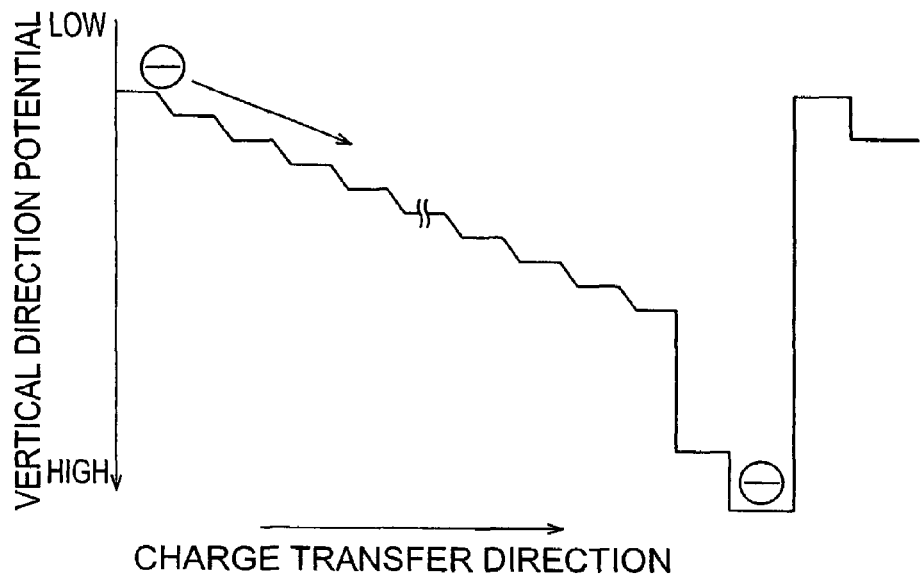
FIG. 4A is a diagram of the vertical direction potential that shows the condition of charges at a time $t_a$ in the solid-state imaging apparatus of the embodiment.
Figure 4B:
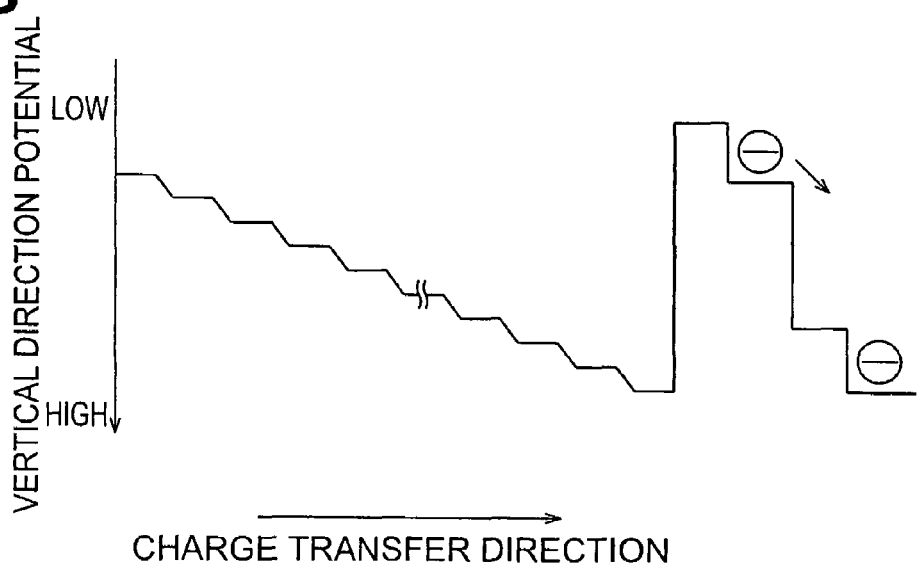
FIG. 4B is a diagram of the vertical direction potential that shows the condition of charges at a time $t_b$ in the solid-state imaging apparatus of the embodiment.

Voltage dividing resistors 17 are connected in series to DC power supply 19, with one end 17a of the set of voltage dividing resistors 17 being kept constantly at a fixed negative potential (see FIG. 3A) and the other end 17b being kept constantly at a fixed positive potential (see FIG. 3B). A DC output potential, generated by a corresponding voltage dividing resistor 17, is thereby applied to each of the plurality of transfer electrodes 15. Thus as shown in FIGS. 4A and 4B, the potential formed at an N-type semiconductor layer 55 below the plurality of transfer electrodes 15 increases gradually in the charge transfer direction and a single potential gradient (a stairs-like gradient) is thus formed for each set of photoelectric conversion portions 13 that are arrayed in the vertical direction. The charges, generated in N-type semiconductor layer 55 below each transfer electrode 15, move along the above-mentioned potential gradient. One end 17a and other end 17b of the set of voltage dividing resistors 17 do not necessarily have to be maintained at a negative potential and a positive potential, respectively. It is sufficient that other end 17b of the set of voltage dividing resistors 17 be kept higher in potential than one end 17a, for example, by setting the potential at one end 17a of the set of voltage dividing resistor 17 to −8V and that at other end 17b to −2V.

Figure 3C:
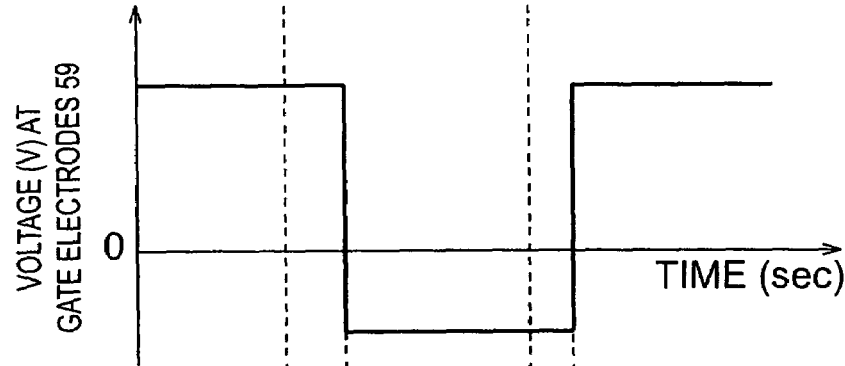
FIG. 3C is a timing chart for describing the operation of the solid-state imaging apparatus of the embodiment and shows the variation of the voltage level of a clock signal that is input into a gate electrode 59.

As shown in FIG. 3C, at time $t_a$, the voltage level of the clock signal input into gate electrodes 59 is the H level. At this time, a potential well that is in accordance with the H-level voltage is formed in each N-type semiconductor layer 55 (region) below gate electrodes 59 as shown in FIG. 4A and the charges that have moved along the above-mentioned potential gradient become accumulated in this potential well. The charges are thereby transferred to vertical transfer gate portion 21 and summed (line-binned) according to each set of photoelectric conversion portions 13 that are arrayed in the vertical direction. N-type semiconductor region 55a is higher in potential than barrier region 63.

The voltage level of the clock signal input into gate electrodes 59 is then switched. At time $t_b$, after the switching, the voltage level of the clock signal input into the electrodes is the L level as shown in FIG. 3C, and the potential of each N-type semiconductor layer 55 (region) and barrier region 63 below gate electrodes 59 becomes low as shown in FIG. 4B. The charges accumulated in the region of N-type semiconductor layer 55 below gate electrodes 59 are thus transferred to N-type semiconductor layer 55 below the set of horizontal transfer electrodes 61. The charges accumulated in vertical transfer gate portion 21 are thus output to horizontal shift register 31.

Figure 3D:
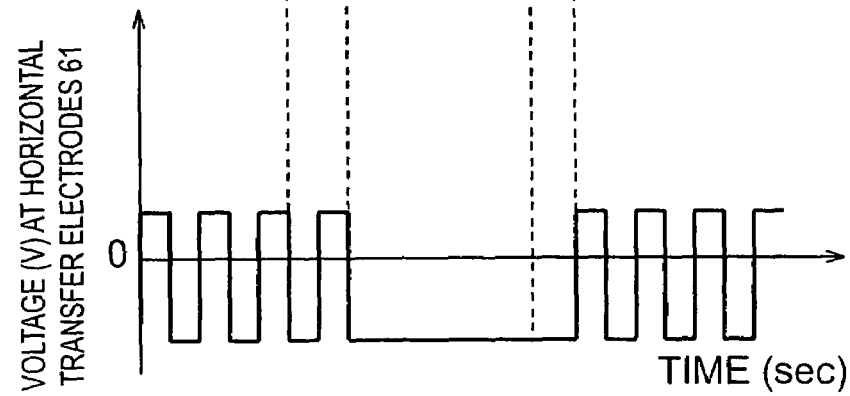
FIG. 3D is a timing chart for describing the operation of the solid-state imaging apparatus of the embodiment and shows the variation of the voltage level of a clock signal input into a set of horizontal transfer electrodes 61.

When the voltage level of the clock signal input into the electrodes switch from the L level to the H level, that is, when the charges accumulated in vertical transfer gate portion 21 are output to horizontal shift register 31, a clock signal is applied to the set of horizontal transfer electrodes 61 of horizontal shift register 31 as shown in FIG. 3D. The charges output to horizontal shift register 31 are thereby transferred successively in the horizontal direction and output to amplifying portion 41.

By the above-described operation, solid-state imaging apparatus 1 functions as a line sensor in the same manner as a one-dimensional photodiode array.

As described above, with solid-state imaging apparatus 1 of the present embodiment, the potential formed below the plurality of transfer electrodes 15 increases gradually in the charge transfer direction and a single potential gradient is formed for each set of photoelectric conversion portions 13 arrayed in the vertical direction. The charges, generated in photoelectric conversion portions 13 (N-type semiconductor layer 55), move along the above-mentioned potential gradient. There is thus no need to apply a drive voltage of predetermined phase for the charge transfer as in the conventional art and the charge transfer can be performed in a simple manner.

Also, since the transfer speed is governed by the potential gradient, that is, by the speed of the charges themselves, the transfer speed is made high and the transfer time can be shortened.

With a line binning operation of a conventional two-dimensional CCD, six times of charge transfer are required to perform binning of six pixels. With solid-state imaging apparatus 1 of the present embodiment, an extremely fast transfer of just once suffices for the transfer for six pixels.

Also with solid-state imaging apparatus 1 of the present embodiment, voltage dividing resistors 17 divide the DC output voltage from DC power supply 19. The above-mentioned potential can thereby be formed in a stable manner.

This invention is not limited to the above-described embodiment. For example, the number of transfer electrodes disposed in each row is not limited to "2" and may instead be "1" or "3" or more. Also, though with the embodiment, the generated charges are summed upon being accumulated in vertical transfer gate portion 21 (charge accumulation portion), this invention is not limited thereto and the charges may be arranged to be accumulated and summed in horizontal shift register 31 (charge outputting portion) without providing vertical transfer gate portion 21.

INDUSTRIAL APPLICABILITY

The present invention can be applied to a solid-state imaging apparatus that can also be used as a one-dimensional line sensor by performing line binning operation of a CCD image sensor, etc.

The invention claimed is:

1. A solid-state imaging apparatus comprising:
an energy ray sensitive region, being formed on a front surface side of a semiconductor substrate, having a plurality of photoelectric conversion portions that are arrayed two-dimensionally, and generating charges in response to the incidence of energy rays;
a plurality of transfer electrodes, each being disposed on the front surface side of the energy ray sensitive region with a first direction of the two-dimensional array as the longitudinal direction and transferring the charges in a second direction of the two-dimensional array; and
voltage dividing resistors, disposed in correspondence to the transfer electrodes and each dividing a DC output voltage from a DC power supply to generate a DC output potential and providing the DC output potential to the corresponding transfer electrode,
wherein a single potential gradient is formed for each set of photoelectric conversion portions arrayed in the second direction of the two-dimensional array below the plurality of transfer electrodes and increases gradually in a charge transfer direction.

2. A solid-state imaging apparatus comprising:
an energy ray sensitive region, being formed on a front surface side of a semiconductor substrate, having a plurality of photoelectric conversion portions that are arrayed two-dimensionally, and generating charges in response to the incidence of energy rays; and
a plurality of transfer electrodes, each being disposed on the front surface side of the energy ray sensitive region with a first direction of the two-dimensional array as the longitudinal direction and transferring the charges in a second direction of the two-dimensional array,
wherein a predetermined potential is applied to each of the plurality of transfer electrodes in such a manner that a single potential gradient is formed for each set of photoelectric conversion portions arrayed in the second direction of the two-dimensional array below the plurality of transfer electrodes, and
wherein the single potential gradient increases gradually in the charge transfer direction.

3. The solid-state imaging apparatus according to claim 1 or 2, further comprising: a charge accumulation portion, accumulating the charges, which have been transferred by the plurality of transfer electrodes, according to each set of the photoelectric conversion portions arrayed in the second direction and outputting the accumulated charges in a batch according to each set of the photoelectric conversion portions; and
a charge outputting portion, inputting and then successively outputting the charges output from the charge accumulation portions according to each of the sets of the photoelectric conversion portions arrayed in the second direction.

* * * * *